(12) United States Patent
Oh et al.

(10) Patent No.: US 8,837,193 B2
(45) Date of Patent: Sep. 16, 2014

(54) MEMORY

(71) Applicant: SK hynix Inc., Gyeonggi-do (KR)

(72) Inventors: Sung-Lae Oh, Gyeonggi-do (KR);
Go-Hyun Lee, Gyeonggi-do (KR);
Chang-Man Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/830,472

(22) Filed: Mar. 14, 2013

(65) Prior Publication Data

US 2014/0185353 A1    Jul. 3, 2014

(30) Foreign Application Priority Data

Dec. 28, 2012    (KR) .......................... 10-2012-0157377

(51) Int. Cl.
*G11C 5/06* (2006.01)

(52) U.S. Cl.
CPC ........................................ *G11C 5/06* (2013.01)
USPC ............................ 365/63; 365/51; 365/185.12

(58) Field of Classification Search
USPC ............................ 365/63, 51, 185.12, 185.13
See application file for complete search history.

(56) References Cited

U.S. PATENT DOCUMENTS 7,876,591 B2 *  1/2011  Kwak ............................ 365/51

FOREIGN PATENT DOCUMENTS

| KR | 1020080113727 | 12/2008 |
| KR | 100965773 | 6/2010 |
| KR | 1020110099508 | 9/2011 |

* cited by examiner

*Primary Examiner* — David Lam
(74) *Attorney, Agent, or Firm* — IP & T Group LLP

(57) ABSTRACT

A memory in accordance with an embodiment of the present invention may include a first page buffer, a second page buffer arranged adjacent to the first page buffer in a first direction, a global pad arranged between the first page buffer and the second page buffer, and a first bit line selection unit arranged adjacent to the first page buffer and the second page buffer in a second direction substantially perpendicular to the first direction, wherein a first bit line pad is formed at a center of the a first bit line selection unit.

18 Claims, 5 Drawing Sheets

MEMORY

CROSS-REFERENCE TO RELATED APPLICATIONS

The present application claims priority of Korean Patent Application No. 10-2012-0157377 filed on Dec. 28, 2012, which is incorporated herein by reference in its entirety.

BACKGROUND

1. Field

Exemplary embodiments of the present invention relate to a memory capable of simplifying an interconnection pattern of a metal line and minimizing an area of the metal line.

2. Description of the Related Art

A memory is classified into a volatile memory and a non-volatile memory according to data retention when power is off. The volatile memory is a memory in which data is lost when power is off. Examples of the volatile memory include a DRAM and a SRAM. The non-volatile memory is a memory in which stored data is retained although power is off. Example of the non-volatile memory includes a flash memory.

FIG. 1 is a circuit diagram illustrating one set of even/odd bit lines BLE and BLO, a bit line selection unit 110, and a page buffer 120 that correspond to one another in a memory in accordance with prior art.

As illustrated in FIG. 1, a page buffer 120 corresponds to two bit lines, that is, the even bit line BLE and the odd bit line BLO, and the bit line selection unit 110 is connected between the page buffer 120 and the two bit lines BLE and BLO that correspond to each other, and electrically connects a selected one of the two bit lines BLE and BLO to the page buffer 120 in response to bit line selection signals SEL_BLE and SEL_BLO.

The bit line selection unit 110 includes an even selection transistor N1, which is turned on/off in response to the even bit line selection signal SEL_BLE, and an odd selection transistor N2, which is turned on/off in response to the odd bit line selection signal SEL_BLO. The even selection transistor N1 is turned on when the even bit line selection signal SEL_BLE is activated, and electrically connects the even bit line BLE to the page buffer 120. The odd selection transistor N2 is turned on when the odd bit line selection signal SEL_BLO is activated, and electrically connects the odd bit line BLO to the page buffer 120.

The page buffer 120 performs an operation for detecting a voltage of an electrically connected bit line or driving the bit line by a specific voltage when performing a program operation, a verification operation, a read operation, or an erase operation of a plurality of memory cells (not illustrated in FIG. 1) included in the memory.

Meanwhile, in the memory, a plurality of bit line selection units and a plurality of page buffers are arranged in an array form. That is, the plurality of bit line selection units are arranged in an array form in a bit line selection area, and the plurality of page buffers are arranged in an array form in a page buffer area. Among the plurality of bit line selection units and the plurality of page buffers, a bit line selection unit and a page buffer corresponding to each other are connected to each other through a connection metal line formed across the bit line selection area and the page buffer area.

In the page buffer area, a plurality of global pads are formed to apply a control signal to the plurality of page buffers, and in the bit line selection unit, bit line pads are formed to connect bit lines to each other. Since the connection metal line connects the page buffer to the bit line selection unit while avoiding the plurality of global pads and the bit line pads, patterns of a plurality of connection metal lines become complicated due to the positions of the plurality of global pads and the plurality of bit line pads. Particularly, the complication of the patterns of the plurality of connection metal lines becomes even more complex in an area, where the page buffer area and the bit line selection area are adjacent to each other.

SUMMARY

Exemplary embodiments of the present invention are directed to a memory that simplifies patterns of a plurality of connection metal lines connecting page buffers to bit line selection units through alignment of pads formed in a page buffer area and pads formed in a bit line selection area.

Exemplary embodiments of the present invention are directed to a memory that may adjust the size of a bit line selection unit according to an arrangement position, thereby minimizing an area of the memory.

In accordance with an embodiment of the present invention, a memory may include a first page buffer, a second page buffer arranged adjacent to the first page buffer in a first direction, a global pad arranged between the first page buffer and the second page buffer, and a first bit line selection unit arranged adjacent to the first page buffer and the second page buffer in a second direction substantially perpendicular to the first direction, wherein a first bit line pad is formed at a center of the a first bit line selection unit.

In accordance with another embodiment of the present invention, a memory may include a page buffer area including a plurality of page buffers arranged in Y×M arrays, a first bit line selection area formed adjacent to the page buffer area in the second direction and including a plurality of first bit line selection units arranged in Z×N arrays, and a second bit line selection area formed adjacent to the first bit line selection area in the second direction and including a plurality of second bit line selection units arranged in X×L arrays. A plurality of global pads are formed in the page buffer area, a plurality of first bit line pads are formed in the plurality of first bit line selection units, and wherein global pads, which are formed adjacent to the first bit line selection area among the plurality of global pads, and the first bit line pads of the first bit line selection units, which are formed adjacent to the page buffer area among the plurality of first bit line selection units, are aligned with each other in the second direction.

According to the embodiments of the present invention, a memory may simplify patterns of a plurality of connection metal lines connecting page buffers to bit line selection units through alignment of pads formed in a page buffer area and pads formed in a bit line selection area, which may lead to an easier connection of the metal lines without disturbing the pads.

Furthermore, according to the embodiments of the present invention, a memory may adjust the size of the bit line selection unit according to an arrangement, thereby minimizing an area of the memory.

DETAILED DESCRIPTION

Figure 1:
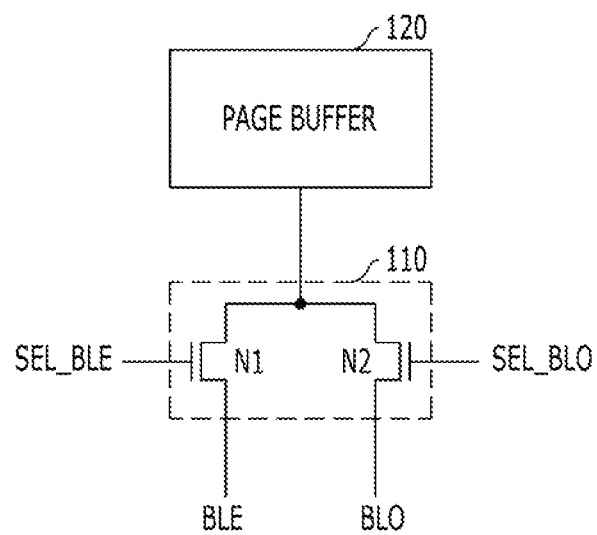
FIG. 1 is a circuit diagram illustrating one set of even/odd bit lines, a bit line selection unit, and a page buffer which correspond to one another in a memory in accordance with prior art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention, it is also noted that in this specification, "connected/coupled" refers to one component not only directly coupling another component but also indirectly coupling another component through an intermediate component. In addition, a singular form may include a plural fore as long as it is not specifically mentioned in a sentence.

For convenience of description in the specification, a planar dimension is expressed as d1×d2, where d1 is measured or counted in a first direction D1 and d2 is measured or counted in a second direction D2, which is perpendicular to the first direction D1.

Figure 2:
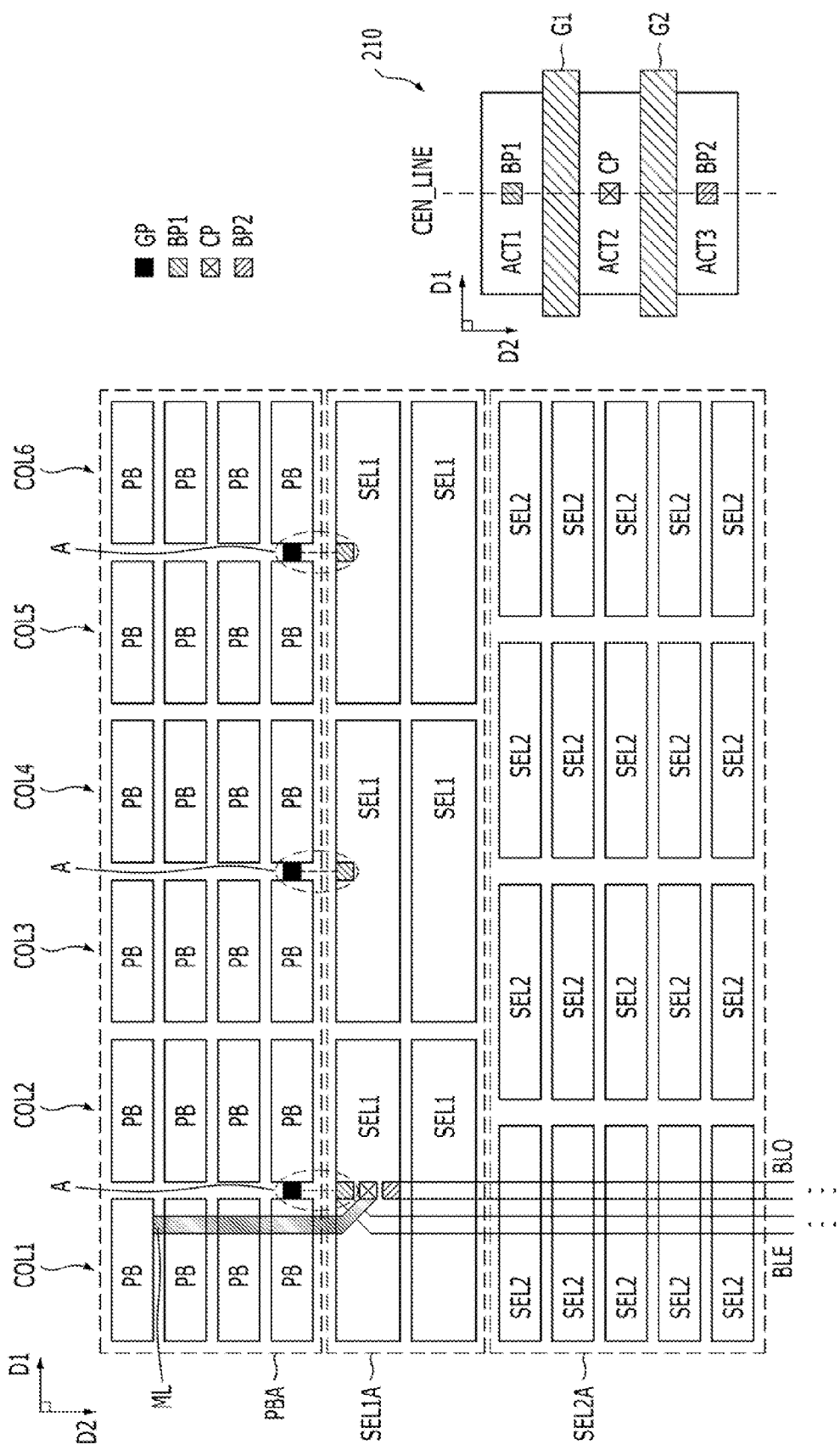
FIG. 2 is a plan view illustrating a memory in accordance with an embodiment of the present invention.

FIG. 2 is a plan view of a memory in accordance with an embodiment of the present invention.

As illustrated in FIG. 2, the memory includes a page buffer area PBA, a first bit line selection area SEL1A, and a second bit line selection area SEL2A. For an exemplary embodiment, the page buffer area PBA may include a plurality of page buffers PB arranged in 6×M arrays. The first bit line selection area SEL1A is formed adjacent to the page buffer area PBA in the second direction D2 and includes a plurality of first bit line selection units SEL1 arranged in 3×N arrays. The second bit line selection area SEL2A is formed adjacent to the first bit line selection area SEL1A in the second direction D2 and includes a plurality of second bit line selection units SEL2 arranged in X×L arrays (3<X). In the page buffer area PBA, a plurality of global pads GP are formed, and in the plurality of first bit line selection units SEL1, a plurality of first bit line pads BP1 are formed. Some of the plurality of global pads GP, which are formed adjacent to the first bit line selection area SEL1A, and the first bit line pads BP1 in some of the plurality of first bit line selection units SEL1, which are formed adjacent to the page buffer area PBA, are aligned with each other in the second direction D2. The memory includes a plurality of planar levels on a plane where elements of the memory are arranged, for example, a transistor level, a first level, and a second level. The plurality of first bit line selection units SEL1, the plurality of second bit line selection units SEL2, and the plurality of page buffers PB are arranged at the transistor level. A plurality of connection metal lines ML are arranged at the first level different from the transistor level. A plurality of even bit lines BLE and a plurality of odd bit lines BLO are arranged at the second level, which is different from the first level. For the purpose of convenience, FIG. 2 illustrates only the connection metal line ML and the even/odd bit lines BLE and BLO that correspond to one page buffer PB and one first bit line selection unit SEL1. The sets of remaining page buffers PB and bit line selection units SEL1 and SEL2 have similar connection structures through the connection metal lines ML and the even/odd bit, lines BLE and BLO (not illustrated) to those shown in FIG. 2.

The memory will be described with reference to FIG. 2 below.

The plurality of even/odd bit lines BLE and BLO, the plurality of first bit line selection units SEL1, the plurality of second bit line selection units SEL2, and the plurality of page buffers PB, which are illustrated in FIG. 2, are arranged at different levels of the same plane. In FIG. 2, the plurality of first bit line selection units SEL1, the plurality of second bit line selection units SEL2, and the plurality of page buffers PB are arranged at the transistor level. The plurality of connection metal lines ML arranged at the first level that is different from the transistor level. The plurality of even/odd bit lines BLE and BLO are arranged at the second level that is different from the first level. FIG. 2 illustrates the case in which the second level is higher than the first level and the first level is higher than the transistor level, which may vary according to various design considerations.

The page buffer area PBA may include the plurality of page buffers PB arranged in 6×M arrays. Hereinafter, a description will be provided for the case in which M is 4, that is, the plurality of page buffers PB are arranged in 6×4 arrays in the page buffer area PBA. In this case, the page buffer area PBA includes 24 page buffers PB. In the first direction D1, the length of the page buffer PB is a half of the length of the first bit line selection unit SEL1. That is, when two page buffers PB are arranged adjacent to each other in the first direction D1, the lengths in the first direction D1 of the two page buffers PB are substantially equal to the length in the first direction D1 of the first bit line selection unit SEL1.

The plurality of global pads GP in the page buffer area PBA are formed in between each of pairs of columns of the array in which the plurality of page buffers PB are arranged, namely between a first column COL1 and a second column COL2, between a third column COL3 and a fourth column COL4, and between a fifth column COL5 and a sixth column COL6 of the array. The plurality of global pads GP are used to apply a control signal for controlling the plurality of page buffers PB. The control signal for controlling the page buffers PB includes a signal for precharging a voltage of a sensing node included in the page buffer PB to which a voltage of a bit line connected to the page buffer PB is transferred, a signal for connecting the bit line to the sensing node to detect the voltage of the bit line, a signal for inputting/outputting data in a plurality of latches included in the page buffer, and the like. Since the present invention is not related to the operation of the page buffer but is related to the positions of pads to which the control signal is applied, a detailed description of the control signal for controlling the page buffer PB will be omitted. The bit line indicates a bit line selected from the even/odd bit lines BLE and BLO corresponding to the page buffer PB, and is connected to the page buffer PB.

The first bit line selection area SEL1A is arranged adjacent to the page buffer area PBA in the second direction D2. The first bit line selection area SEL1A includes a plurality of first bit line selection units SEA arranged in 3×N arrays. Hereinafter, a description will be provided for the case in which N is 2, that is, the plurality of first bit line selection units SEL1 are arranged in the first bit line selection area SEL1A in 3×2 arrays. In this case, the first bit line selection area SEL1A includes six first bit line selection units SEL1.

Each of the plurality of first bit line selection units SEL1 corresponds to each of the plurality of page buffers PB, and is connected to the corresponding page buffer PB through corresponding one of the plurality of connection metal lines ML. Each of the plurality of first bit line selection units SEL1 corresponds to each of the plurality of even bit lines BLE and each of the plurality of odd bit lines BLO.

A first diagram 210 at the right side of the plan view shown in FIG. 2 is an enlarged view of one of the plurality of first bit line selection units SEL1. As illustrated in the first diagram 210, the first bit line selection unit SEL1 includes first to third active areas ACT1, ACT2, and ACT3, first and second gates G1 and G2, a first bit line pad BP1, a second bit line pad BP2, and a connection pad CP.

The first bit line pad BP1 is formed on the center line CEN_LINE in the first direction D1 of the first bit line selection unit SEL1, and is positioned on the first active area ACT1. Through the first bit line pad BP1, the first active area ACT1 is connected to one of the even bit line BLE and the odd bit line BLO that correspond to the first bit line selection unit SEL1.

The second bit line pad BP2 is formed on the center line CEN_LINE in the first direction D1 of the first bit line selection unit SEL1, and is positioned on the third active area ACT3. Through the second bit line pad BP2, the third active area ACT3 is connected to the other one, which is not connected to the first bit line pad BP1 of the even bit line BLE and the odd bit line BLO that correspond to the first bit line selection unit SEL1.

The connection pad CP is formed on the center line CEN_LINE in the first direction D1 of the first bit line selection unit SEL1, and is positioned on the second active area ACT2. Through the connection pad CP, the second active area ACT2 is connected to the connection metal line ML that is connected to the page buffer PB corresponding to the first bit line selection unit SEL1.

Referring to a part A illustrated in FIG. 2, the first bit line pad BP1 of the first bit line selection units SEL1, which are arranged adjacent to the page buffer area PBA, and the global pad GP, which is arranged adjacent to and the first bit line selection area SEL1A, are aligned with each other in the second direction D2. The first bit line pad BP1 and the global pad GP may be arranged as described above because according to the embodiment of the present invention because the length in the first direction D1 of the first bit line selection unit SEL1 is twice as long as the length in the first direction D1 of the page buffer PB, the first bit line pad BP1 is positioned on the center line in the first direction D1 of the first bit line selection unit SEL1, and the global pads GP are positioned between two adjacent page buffers PB.

The second bit line selection area SEL2A is arranged adjacent to the first bit line selection area SEL1A in the second direction D2.

The second bit line selection area SEL2A includes the plurality of second bit line selection units SEL2 arranged in X×L arrays (3<X). Hereinafter, a description will be provided for the exemplary case in which X is 4 and L is 5, that is, the plurality of second bit line selection areas SEL2A are arranged in the second bit line selection area SEL2A in 4×5 arrays. In this case, the second bit line selection area SEL2A includes 20 second bit line selection units SEL2.

Each of the plurality of second bit line selection units SEL2 corresponds to one of the plurality of page buffers PB, and is connected to the corresponding page buffer PB through corresponding one of the plurality of connection metal lines ML. Each of the plurality of second bit line selection units SEL2 corresponds to one of the plurality of even bit lines BLE and one of the plurality of odd bit lines BLO.

The arrangement and configuration of the second bit line selection unit SEL2 are substantially equal to those of the first bit line selection unit SEL1 illustrated in the first diagram 210, except that the length in the first direction D1 of the second bit line selection unit SEL2 is shorter than the length in the first direction D1 of the first bit line selection unit SEL1. That is, the configuration of the first bit line selection unit SEL1 is substantially equal to that of the second bit line selection unit SEL2, but the length in the first direction D1 of the first bit line selection unit SEL1 is longer than the length in the first direction D1 of the second bit line selection unit SEL2.

In the first direction D1, the lengths of the page buffer area PBA, the first bit line selection area SEL1A, and the second bit line selection area SEL2A are substantially equal to one another. As described above, the length in the first direction D1 of the first bit line selection unit SEL1 is longer than the length in the first direction D1 of the second bit line selection unit SEL2. Accordingly, a space occupied by the second bit line selection unit SEL2 is smaller than a space occupied by the first bit line selection unit SEL1.

In the memory according to the embodiment of the present invention, the global pads GP, which are formed adjacent to the first bit line selection area SEL1A, and the first bit line pads BP1, which are formed adjacent to the page buffer area PBA, are allowed to be aligned with each other, resulting in the simplification of the patterns of the connection metal lines ML for connecting the bit line selection units SEL1 and SEL2 to the page buffers PB in the area around boundary between the first bit line selection area SEL1A and the page buffer area PBA. Furthermore, according to the embodiment of the present invention, increase of the length in the first direction D1 of the bit line selection units SEL1 in the first bit line selection area SEL1A adjacent to the page buffer area PBA may make the patterns of the connection metal lines ML simple. On the other hand, in the second bit line selection area SEL2A, which is arranged relatively farther from the page buffer area PBA than the first bit line selection area SEL1A, the bit line selection units SEL2, whose length in the first direction D1 is shorter than that of the bit line selection units SEL1, may lead to the smaller size of the memory.

Figure 3:
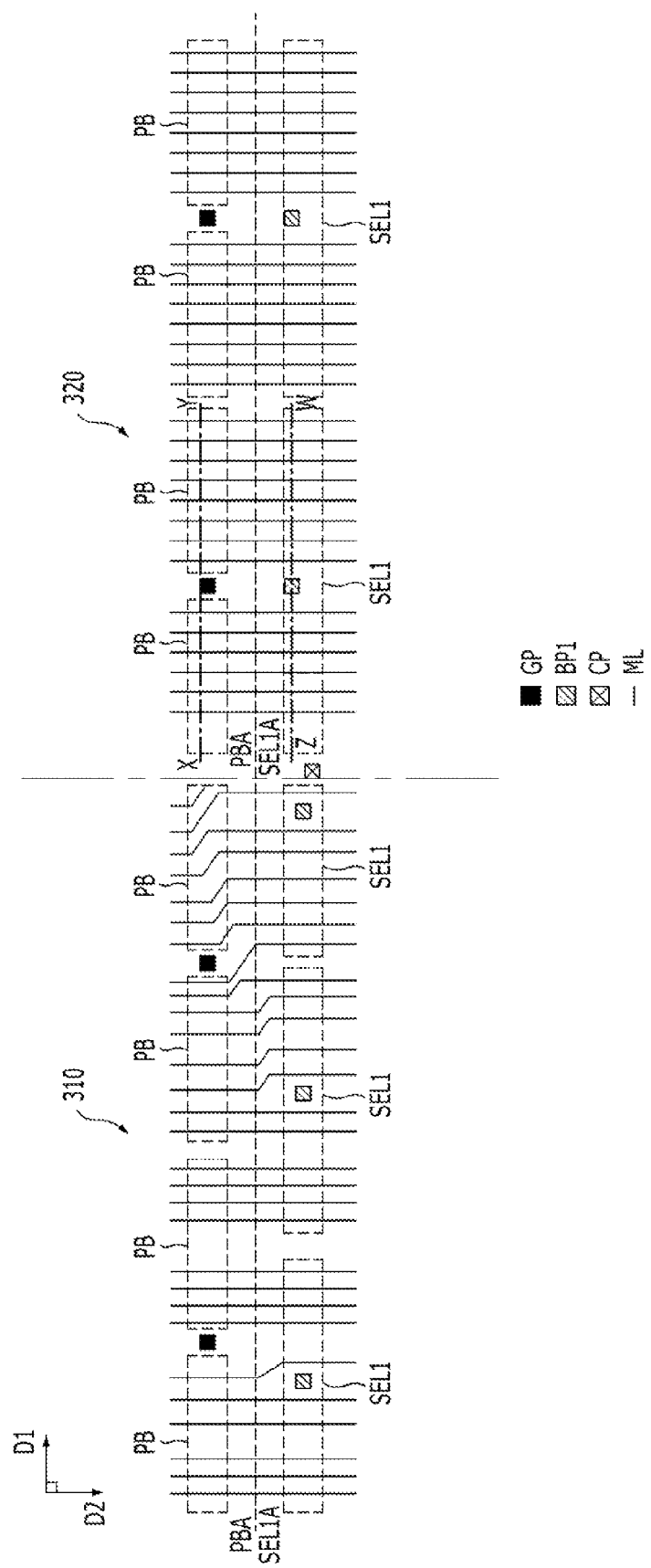
FIG. 3 is a plan view of a first level of the memory illustrating interconnections of connection metal lines in the area around boundary between a page buffer area and a first bit line selection area.

FIG. 3 is a plan view of the first level of the memory illustrating interconnections of the connection metal lines ML in the area around boundary between the page buffer area PBA and the first bit line selection area SEL1A to show difference between a prior art and the embodiment of the present invention. A first diagram 310 illustrates the interconnections of the connection metal lines ML when the length in the first direction D1 of the first bit line selection unit SEL1 is substantially equal to the length in the first direction D1 of the second bit line selection unit SEL2, and a second diagram 320 illustrates the interconnections of the connection metal lines ML in the case of the memory of FIG. 2 according to the embodiment of the present invention. Since the first bit line selection unit SEL1 and the page buffer PB are not arranged at the first level, they are indicated by dotted lines in FIG. 3. For the purpose of convenience, the metal lines ML are indicated by solid lines.

As illustrated in the first diagram 310, where the length in the first direction D1 of the first bit line selection unit SEL1 is substantially equal to the length in the first direction D1 of the second bit line selection unit SEL2, the global pads GP arranged adjacent to the first bit line selection area SEL1A, and the first bit line pads BP1 of the first bit line selection units SEL1 arranged adjacent to the page buffer area PBA, are not aligned with each other in the second direction D2. That is, the global pads GP and the first bit line pads BP1, which are adjacent to each other, are not aligned, which makes the patterns of the connection metal lines ML complicated in the area around boundary between the page buffer area PBA and the first bit line selection area SEL1A.

As illustrated in the second diagram 320, which is the embodiment of the present invention shown in FIG. 2, the global pads GP, which are arranged adjacent to the first bit line selection area SEL1A, and the first bit line pads BP1 of the first bit line selection units SEL1, which are arranged adjacent to the page buffer area PBA, are aligned with each other in the second direction D2. That is, the global pads GP and the first bit line pads BP1, which are adjacent to each other, are aligned, which may make the patterns of the connection metal lines ML simpler in the area around boundary between the page buffer area PBA and the first bit line selection area SEL1A.

Figure 4:
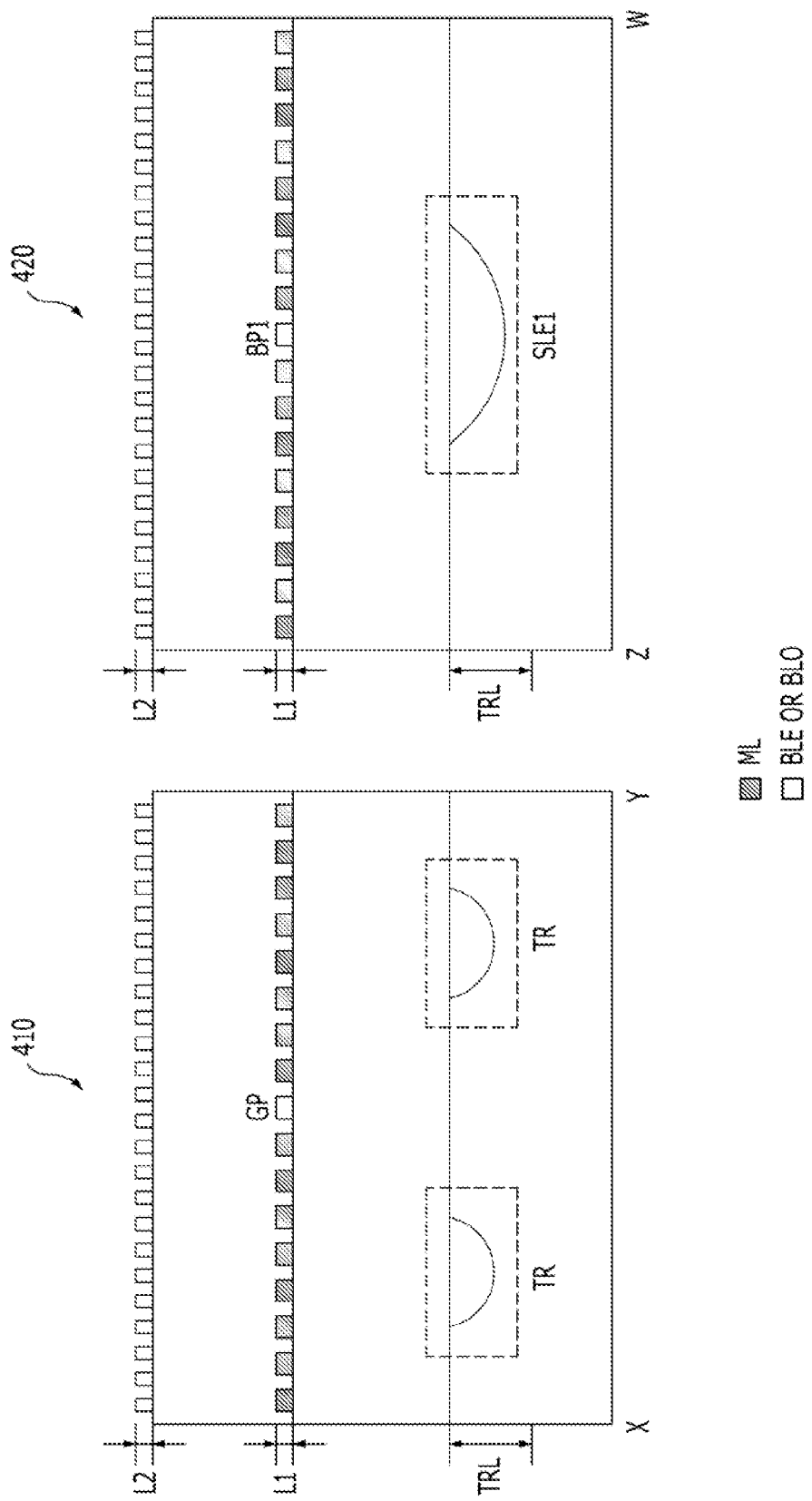
FIG. 4 illustrates a sectional view taken along line XY and line ZW of FIG. 3.

FIG. 4 is a sectional view taken along line XY and line ZW of FIG. 3.

A first diagram 410 is a sectional view taken along line XY and a second diagram 420 is a sectional view taken along line ZW. The lines XY and ZW are in the area around boundary between the first bit line selection area SEL1A and the page buffer area PBA.

As illustrated in the first diagram 410, a transistor TR included in the page buffer PB is arranged at a transistor level TRL of the page buffer area PBA adjacent to the first bit line selection area SEL1A, the plurality of connection metal lines ML and the global pads GP are arranged at a first level L1, and the even bit line BLE and the odd bit line BLO are arranged at a second level L2.

As illustrated in the second diagram 420, the first bit line selection unit SEL1 is formed to have the transistor level TRL of the first bit line selection area SEL1A adjacent to the page buffer area PBA, the plurality of connection metal lines ML and the first bit line pads BP1 are arranged at the first level L1, and the even bit line BLE and the odd bit line BLO are arranged at the second level L2.

Figure 5:
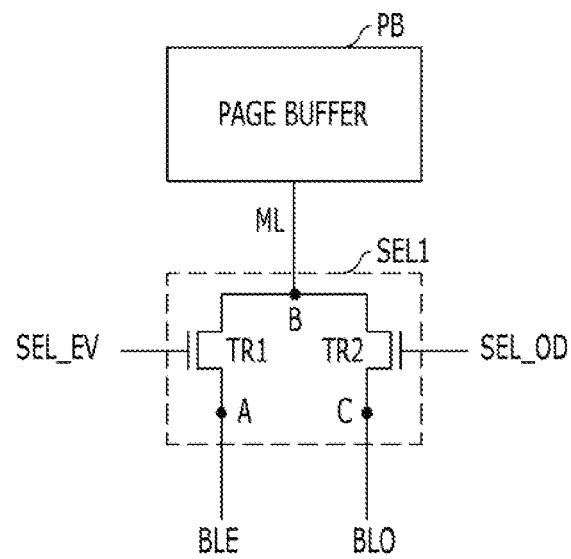
FIG. 5 is a circuit diagram illustrating one set of a page buffer, a connection metal line, a first bit line selection unit, and even/odd bit lines that correspond to one another.

FIG. 5 is a circuit diagram illustrating one set of the page buffer PB, the connection metal line ML, the first bit line selection unit SEL1, and the even/odd bit lines BLE and BLO that correspond to one another.

As illustrated in FIG. 5, the first bit line selection unit SEL1 includes a first transistor TR1 and a second transistor TR2 connected to each other at a shared end B. The other end A of the first transistor TR1 corresponds to the first active area ACT1 described in FIG. 2. The other end C of the second transistor TR2 corresponds to the third active area ACT3 described in FIG. 2. The shared end B of the first transistor TR1 and the second transistor TR2 connected to each other corresponds to the second active area ACT2 described in FIG. 2.

The first transistor TR1 is connected between the even bit line BLE and the page buffer PB, and is turned on when an even selection signal SEL_EV is activated, thereby connecting to the even bit line BLE through the first bit line pad BP1.

The second transistor TR2 is connected between the odd bit line BLO and the page buffer PB, and is turned on when an odd selection signal SEL_OD is activated, thereby connecting to the odd bit line BLO through the second bit line pad BP2.

The second active area ACT2 is shared by the first transistor TR1 and the second transistor TR2. The second active area ACT2 is connected to the connection metal line ML through the connection pad CP. The connection metal line ML connects the page buffer PB to the shared end B of the first transistor TR1 and the second transistor TR2, which corresponds to the second active area ACT2.

The page buffer PB detects a voltage of a bit line connected to the page buffer PB or drives the bit line by a proper voltage when performing a program operation, a verification operation, a read operation, or an erase operation of the memory. The program operation is an operation for applying a program pulse to a memory cell to store data, the verification operation is an operation for checking whether the memory cell has been normally programmed, the read operation is an operation for reading data stored in the memory cell, and the erase operation is an operation for erasing the data stored in the memory cell. Since the operations performed by the page buffer PB are well-known to those skilled in the art and the present invention does not relate to the function of the page buffer PB, a detailed description thereof will be omitted.

Figure 6:
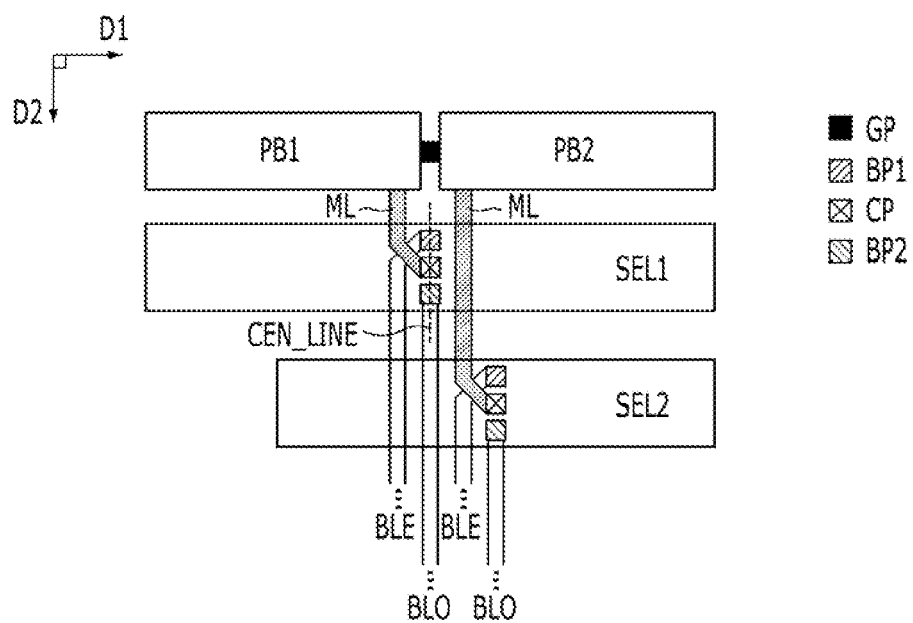
FIG. 6 is a plan view of a memory in accordance with another embodiment of the present invention.

FIG. 6 is a plan view of a memory in accordance with another embodiment of the present invention.

As illustrated in FIG. 6, the memory includes a first page buffer P51, a second page buffer PB2 arranged adjacent to the first page buffer PB1 in a first direction D1, a global pad GP arranged between the first page buffer PB1 and the second page buffer P52, and a first bit line selection unit SEL1 arranged adjacent to the first page buffer PB1 and the second page buffer PB2 in a second direction D2. The first bit line selection unit SEL1 is provided at the center CEN_LINE thereof with a first bit line pad BP1, a second bit line pad BP2, and a connection pad CP aligned with one another and the global pad GP. Furthermore, the memory includes a second bit line selection unit SEL2 that is adjacent to or spaced apart from the first bit line selection unit SEL1 in the second direction D2, and has a length in the first direction D1, which is shorter than a length in the first direction D1 of the first bit line selection unit SEL1.

The memory will be described with reference to FIG. 6 below.

A plurality of even/odd bit lines BLE and BLO, the first bit line selection unit SEL1, the second bit line selection unit SEL2, the first page buffer PB1, and the second page buffer PB2 are arranged on the same plane, but are formed to have levels different from one another. In FIG. 6, the first bit line selection unit SEL1, the second bit line selection unit SEL2, the first page buffer PB1, and the second page buffer PB2 are arranged at a transistor level, a plurality of connection metal lines ML are arranged at a first level that is different from the transistor level, and the even/odd bit lines BLE and BLO are arranged at a second level that is different from the first level. FIG. 6 illustrates the case in which the second level is higher than the first level and the first level is higher than the transistor level that may vary according to design.

The sum of the lengths in the first direction D1 of the first page buffer PB1 and the second page buffer PB2 is substantially equal to the length in the first direction D1 of the first bit line selection unit SEL1, and each of the length in the first direction D1 of the first page buffer PB1 and the second page buffer PB2 is a half of the length in the first direction D1 of the first bit line selection unit SEL1. Accordingly, as illustrated in FIG. 6, the global pad GP is arranged on the center line CEN_LINE of the first bit line selection unit SEL1.

The dimensions and arrangements of the first bit line selection unit SEL1 and the second bit line selection unit SEL2 is substantially equal to those of the first bit line selection unit SEL1 and the second bit line selection unit SEL2 described in FIG. 2. Since the first bit line pad BP1 of the first bit line selection unit SEL1 is formed on the center line CEN_LINE of the first bit line selection unit SEL1, the global pad GP and the first bit line pad BP1 of the first bit line selection unit SEL1 are aligned with each other in a second direction D2. Consequently similar to the embodiment of the present invention shown in FIGS. 2 to 5, the patterns of the connection metal line ML described in FIG. 2 may be simplified at an area where the page buffers PB1 and PB2 and the first bit line selection unit SEL1 are adjacent to each other. Furthermore, since the length in the first direction D1 of the second bit line selection unit SEL2 is shorter than the length in the first direction D1 of the first bit line selection unit SEL1, a space occupied by the second bit line selection unit SEL2 is smaller than a space occupied by the first bit line selection unit SEL1.

The first bit line selection unit SEL1 corresponds to the even bit line BLE, the odd bit line BLO, and the corresponding page buffer PB1, one of the even bit line BLE the odd bit line BLO is connected to the first bit line pad BP1, the other one is connected to the second bit line pad BP2, and the corresponding page buffer PB1 is connected to the connection pad CP. The second bit line selection unit SEL2 corresponds to the even bit line BLE, the odd bit line BLO, and the page buffer PB2, and is connected to bit lines BLE and BLO and the second page buffer PB2, which correspond to the second bit line selection unit SEL2, similarly to the above.

The first bit line pad BP1 and the global pad GP may be arranged as described above according to another embodiment of the present invention because the length in the first direction D1 of the first bit line selection unit SEL1 is twice as long as the length in the first direction D1 of the page buffer PB, the first bit line pad BP1 is positioned on the center line in the first direction D1 of the first bit line selection unit SEL1 and the global pads GP are positioned between two adjacent page buffers PB.

In the memory according to another embodiment of the present invention, the global pads GP formed adjacent to the first bit line selection unit SEL1, and the first bit line pad BP1 formed adjacent to the page buffer PB1, are allowed to be aligned with each other, resulting in the simplification of the patterns of the connection metal lines ML for connecting the bit line selection units SEL1 and SEL2 to the page buffers PB1 and PB2 in the area around boundary between the first bit line selection unit SEL1 and the page buffers PB1 and PB2. Furthermore, according to another embodiment of the present invention, increase of the length in the first direction D1 of the bit line selection unit SEL1 adjacent to the page buffers P81 and PB2 may make the patterns of the connection metal lines ML simpler. On the other hand, due to the second bit line selection unit SEL2, which is arranged relatively farther from the page buffers PB1 and PB2 compared to the first bit line selection unit SEL1 and has length in the first direction D1 that is shorter than that of the bit line selection unit SEL1, size of the memory may become smaller.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
   a first page buffer;
   a second page buffer arranged adjacent to the first page buffer in a first direction;
   a global pad arranged between the first page buffer and the second page buffer; and
   a first bit line selection unit arranged adjacent to the first page buffer and the second page buffer in a second direction substantially perpendicular to the first direction, wherein a first bit line pad is formed near a center of the a first bit line selection unit.

2. The memory of claim 1, wherein a sum of lengths in the first direction of the first page buffer and the second page buffer is substantially equal to a length in the first direction of the first bit line selection unit, and wherein each of the lengths in the first direction of the first page buffer and the second page buffer is a half of the length in the first direction of the first bit line selection unit.

3. The memory of claim 1, wherein the global pad and the first bit line pad are aligned with each other in the second direction.

4. The memory of claim 1, further comprising:
   a second bit line selection unit that is arranged adjacent to or spaced apart from the first bit line selection unit in the first direction, and is shorter than the first bit line selection unit in the first direction.

5. The memory of claim 1, wherein a connection pad and a second bit line pad are formed near the center of the first bit line selection unit.

6. The memory of claim 5, wherein the first bit line selection unit corresponds to an even bit line, an odd bit line, and a page buffer, wherein one of the even bit line and the odd bit line is connected to the first bit line pad, a remaining one of the even bit line and the odd bit line is connected to the second bit line pad, and wherein the corresponding page buffer is connected to the connection pad.

7. The memory of claim 1, wherein the global pad is used to apply a control signal to the first page buffer or the second page buffer.

8. A memory comprising:
   a page buffer area including a plurality of page buffers arranged in Y×M arrays;
   a first bit line selection area formed adjacent to the page buffer area in the second direction and including a plurality of first bit line selection units arranged in Z(Z=Y/2)×N arrays; and
   a second bit line selection area formed adjacent to the first bit line selection area in the second direction and including a plurality of second bit line selection units arranged in X(Z<X)×L arrays,
   wherein a plurality of global pads are formed in the page buffer area, a plurality of first bit line pads are formed in the plurality of first bit line selection units, and wherein global pads, which are formed adjacent to the first bit line selection area among the plurality of global pads, and the first bit line pads of the first bit line selection units, which are formed adjacent to the page buffer area among the plurality of first bit line selection units, are aligned with each other in the second direction.

9. The memory of claim 8, wherein a length in the first direction of the page buffer is a half of a length in the first direction of the first bit line selection unit.

10. The memory of claim 8, wherein at least one of the plurality of global pads in the page buffer area is formed in between a pair of columns of the array in which the plurality of page buffers PB are arranged, and wherein the plurality of first bit line pads are formed on a center line in the first direction of the plurality of first bit line selection units.

11. The memory of claim 8, wherein one of a plurality of connection pads and one of a plurality of second bit line pads are formed near a center in the first direction of at least one of the plurality of first bit line selection units, and wherein another one of the plurality of first bit line pads, another one of the plurality of connection pads, and another one of the plurality of second bit line pads are formed near the center in the first direction of at least one of the plurality of second bit line selection units.

12. The memory of claim 11, further comprising:
a plurality of connection metal lines formed at a first level that is different from a transistor level where the plurality of page buffers, the plurality of first bit line selection units, and the a plurality of second bit line selection units are arranged; and
a plurality of even bit lines and a plurality of odd bit lines formed at a second level that is different from the first level.

13. The memory of claim 12, wherein each of the plurality of first bit line selection units corresponds to one of the plurality of even bit lines, each of the plurality of second bit line selection units corresponds to one of the plurality of odd bit lines, wherein one of the even bit line and the odd bit line, which correspond to the first or second bit line selection unit, is connected to the first bit line pad of the first or second bit line selection unit, and wherein the other one of the corresponding even bit line and the corresponding odd bit line is connected to the second bit line pad of the first or second bit line selection unit.

14. The memory of claim 13, wherein each of the plurality of first bit line selection units corresponds to one of the plurality of page buffers, and the plurality of second bit line selection units corresponds to one of the plurality of page buffers, and wherein the page buffer corresponding to the first or second bit line selection unit is connected to the connection pad of the first or second bit line selection unit through corresponding one of the plurality of connection metal lines.

15. The memory of claim 12, wherein the second level is higher than the first level.

16. The memory of claim 8, wherein the plurality of global pads used to apply a control signal to the plurality of page buffers.

17. The memory of claim 8, wherein a length in the first direction of the first bit line selection unit is longer than a length in the first direction of the second bit line selection unit.

18. The memory of claim 8, wherein lengths in the first direction of the page buffer area, the first bit line selection area, and the second bit line selection area are substantially equal to one another.

* * * * *